(12) United States Patent
Di IDihuweii et al.

(10) Patent No.: US 11,457,543 B2
(45) Date of Patent: Sep. 27, 2022

(54) INFORMATION HANDLING SYSTEM WITH A TANDEM FAN PACKAGE

(71) Applicant: DELL PRODUCTS, LP, Round Rock, TX (US)

(72) Inventors: Harris Di IDihuweii, Shanghai (CN); Mingming Zhang, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/179,721

(22) Filed: Feb. 19, 2021

(65) Prior Publication Data

US 2022/0210944 A1 Jun. 30, 2022

(30) Foreign Application Priority Data

Dec. 24, 2020 (CN) .......................... 202011555508.X (51) Int. Cl.
*H05K 7/20* (2006.01)
*G06F 1/20* (2006.01)

(52) U.S. Cl.
CPC ......... *H05K 7/20172* (2013.01); *G06F 1/203* (2013.01)

(58) Field of Classification Search
CPC .. H05K 7/20181; H05K 7/20172; H05K 7/20; H05K 7/20145; H05K 7/20136; G06F 1/20; G06F 1/203
See application file for complete search history.

(56) References Cited

U.S. PATENT DOCUMENTS

| | | | | |
|---|---|---|---|---|
| 5,793,610 A | * | 8/1998 | Schmitt ............. | H05K 7/20581 361/679.48 |
| 6,005,770 A | * | 12/1999 | Schmitt .................... | G06F 1/20 361/679.48 |
| 6,011,689 A | * | 1/2000 | Wrycraft ................... | G06F 1/20 361/679.48 |
| 6,115,250 A | * | 9/2000 | Schmitt .................... | G06F 1/20 165/104.34 |
| 6,244,818 B1 | * | 6/2001 | Chang ................... | F04D 29/703 416/247 R |
| 6,364,761 B1 | * | 4/2002 | Steinbrecher ........ | H05K 7/2019 361/695 |

(Continued)

FOREIGN PATENT DOCUMENTS

| | | | | |
|---|---|---|---|---|
| WO | WO-2005049423 A2 | * | 6/2005 | ........... B64C 11/001 |
| WO | WO-2010048730 A2 | * | 5/2010 | ........... F04D 19/007 |

OTHER PUBLICATIONS

Harrison H, Multistage flow optimizer, WO2010/048730 (Year: 2010).*

(Continued)

*Primary Examiner* — Michael A Matey
(74) *Attorney, Agent, or Firm* — Larson Newman, LLP (57) ABSTRACT

A fan package of an information handling system includes a rear cooling fan, a front cooling fan, and a fan fin package. The rear cooling fan generates a first airflow. The front cooling fan generates a second airflow. The fan fin package is in physical communication with the rear cooling fan and the front cooling fan. The fan fin package includes multiple fins. Based on the first airflow and the second airflow, the fins rotate between a closed position and an open position. The fins are biased toward the closed position.

20 Claims, 4 Drawing Sheets

(56) References Cited

U.S. PATENT DOCUMENTS

| | | | | |
|---|---|---|---|---|
| 6,799,942 | B1* | 10/2004 | Tzeng | F04D 29/542 415/209.1 |
| 6,920,045 | B2* | 7/2005 | Huang | H01L 23/467 361/698 |
| 7,031,157 | B2* | 4/2006 | Horng | H05K 7/20172 415/220 |
| 7,385,813 | B2* | 6/2008 | Lin | H05K 7/20172 174/15.1 |
| 7,586,742 | B2* | 9/2009 | Chiu | H05K 7/20172 174/15.1 |
| 7,796,386 | B2* | 9/2010 | Chou | H05K 7/20181 361/679.48 |
| 7,836,704 | B2* | 11/2010 | Lee | H05K 7/206 62/3.2 |
| 8,475,119 | B2* | 7/2013 | Li | H05K 7/20181 361/679.48 |
| 8,770,925 | B2* | 7/2014 | Liu | H05K 7/20181 415/148 |
| 9,482,349 | B2* | 11/2016 | Anderl | H05K 7/20727 |
| 9,521,778 | B2 | 12/2016 | Lin et al. | |
| 10,813,248 | B2* | 10/2020 | Gupta | H05K 7/20581 |
| 11,191,183 | B1* | 11/2021 | Lin | H05K 7/20736 |
| 2002/0098792 | A1* | 7/2002 | Hsiao | H05K 7/20172 454/184 |
| 2002/0189789 | A1* | 12/2002 | Lin | H01L 23/467 174/16.3 |
| 2003/0026691 | A1* | 2/2003 | Huang | F04D 25/0613 415/121.2 |
| 2003/0194313 | A1* | 10/2003 | Lin | F01D 1/02 415/198.1 |
| 2004/0141288 | A1* | 7/2004 | Franz | G06F 1/20 361/695 |
| 2005/0241810 | A1* | 11/2005 | Malone | F04D 25/166 165/122 |
| 2006/0152901 | A1* | 7/2006 | Espinoza-Ibarra | F04D 25/0613 361/695 |
| 2007/0081888 | A1* | 4/2007 | Harrison | F04D 19/007 257/E23.099 |
| 2007/0207723 | A1* | 9/2007 | Baker | F04D 25/14 454/229 |
| 2008/0145246 | A1* | 6/2008 | Lee | F04D 25/14 417/423.14 |
| 2008/0310103 | A1* | 12/2008 | Della Fiora | H05K 7/20727 454/259 |
| 2009/0040714 | A1* | 2/2009 | Yamada | H05K 7/20172 361/679.48 |
| 2009/0262499 | A1* | 10/2009 | Chou | H05K 7/20181 361/695 |
| 2010/0003126 | A1* | 1/2010 | Wang | H05K 7/20181 454/284 |
| 2010/0089549 | A1* | 4/2010 | Su | F04D 29/441 165/80.3 |
| 2011/0164384 | A1* | 7/2011 | Vogel | F28D 1/024 165/122 |
| 2011/0228477 | A1* | 9/2011 | Hong | H05K 7/20181 165/96 |
| 2011/0236194 | A1* | 9/2011 | Ge | F04D 27/00 138/140 |
| 2011/0259550 | A1* | 10/2011 | Komaba | F16K 15/035 137/527 |
| 2012/0138262 | A1* | 6/2012 | Zhang | F04D 29/601 165/67 |
| 2012/0145257 | A1* | 6/2012 | Li | F04D 25/166 137/215 |
| 2013/0004308 | A1* | 1/2013 | Li | H05K 7/20009 415/208.1 |
| 2013/0023199 | A1* | 1/2013 | Li | H05K 7/20181 454/355 |
| 2013/0108431 | A1* | 5/2013 | He | G06F 1/20 415/208.1 |
| 2013/0109290 | A1* | 5/2013 | Jones | G06F 1/206 454/258 |
| 2013/0260665 | A1* | 10/2013 | Sun | H05K 7/20181 454/184 |
| 2013/0323044 | A1* | 12/2013 | Sun | F04D 25/14 415/213.1 |
| 2014/0127011 | A1* | 5/2014 | Sun | F01D 25/28 415/213.1 |
| 2014/0211419 | A1* | 7/2014 | Liao | H05K 7/20181 361/695 |
| 2015/0010391 | A1* | 1/2015 | Ma | H05K 7/20172 415/151 |
| 2016/0081223 | A1* | 3/2016 | Wilcox | H05K 7/20181 454/259 |
| 2016/0165750 | A1* | 6/2016 | Tang | H05K 7/20172 361/692 |
| 2016/0219754 | A1* | 7/2016 | Anderl | F04D 25/166 |
| 2017/0130736 | A1* | 5/2017 | Cruz | F04D 27/001 |
| 2018/0112669 | A1 | 4/2018 | Bhutani et al. | |
| 2018/0208016 | A1* | 7/2018 | O'Brien | B60H 1/00207 |
| 2018/0376614 | A1* | 12/2018 | Xiong | H05K 7/20181 |
| 2019/0011194 | A1* | 1/2019 | Mulinti | F24F 5/0075 |
| 2019/0301489 | A1* | 10/2019 | Chen | F04D 19/002 |
| 2021/0270278 | A1* | 9/2021 | Gao | F04D 25/166 |
| 2021/0362836 | A1* | 11/2021 | Parks | B64C 11/001 |

OTHER PUBLICATIONS

Harrison H, Coaxial propulsion systems with flow modification element WO2005049423 (Year: 2005).*

* cited by examiner

INFORMATION HANDLING SYSTEM WITH A TANDEM FAN PACKAGE

CROSS REFERENCE TO RELATED APPLICATIONS

The present application claims priority from Chinese Patent Application No. 202011555508.X, filed Dec. 24, 2020, entitled "Information Handling system with a Tandem Fan Package," which is assigned to the current assignee hereof and incorporated herein by reference in its entirety.

FIELD OF THE DISCLOSURE

The present disclosure generally relates to information handling systems, and more particularly relates to an information handling system with a tandem fan package.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A fan package of an information handling system includes a rear cooling fan, a front cooling fan, and a fan fin package. The rear cooling fan may generate a first airflow. The front cooling fan may generate a second airflow. The fan fin package is in physical communication with the rear cooling fan and the front cooling fan. The fan fin package includes multiple fins. Based on the first airflow and the second airflow, the fins may rotate between a closed position and an open position. The fins may be biased toward the closed position.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
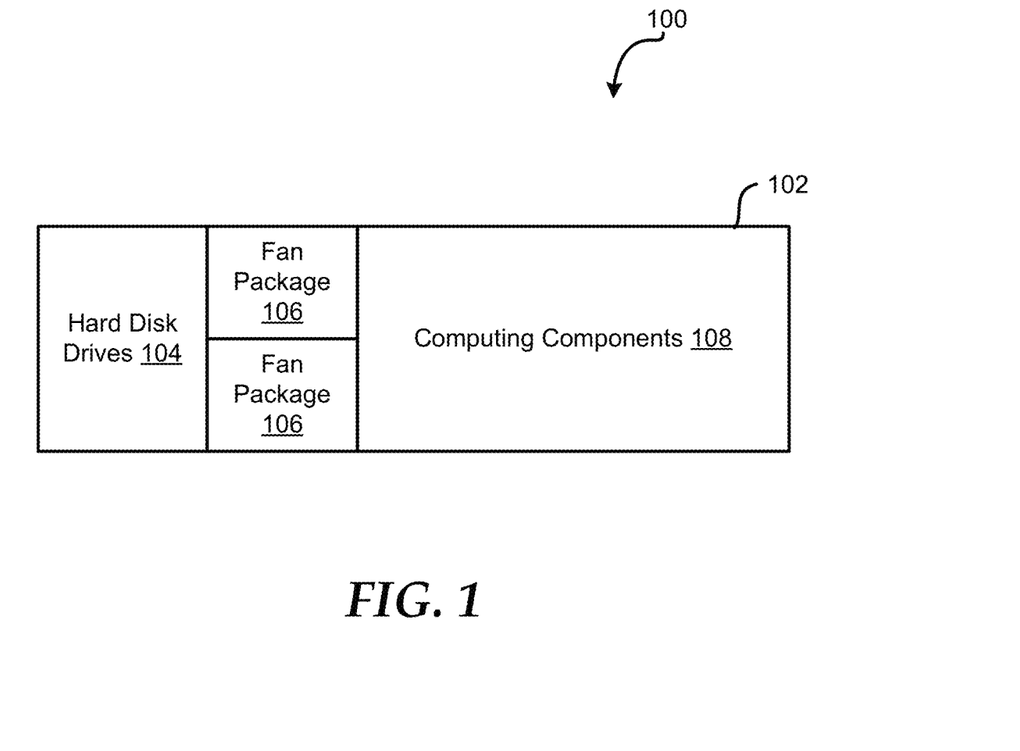
FIG. 1 is a block diagram of a portion of an information handling system according to at least one embodiment of the disclosure.

FIG. 1 shows an information handling system or server 100 according to at least one embodiment of the disclosure. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

Information handling system 100 includes a chassis 102, one or more hard disk drives (HDDs) 104, multiple cooling fan packages 106, and computing components 108. In certain examples, computing components 108 may include any suitable components for information handling system 100 including, but not limited to, one or more central processing units (CPUs), one or more graphic processing units (GPUs), and one or more input/output (I/O) devices. Information handling system 100 may include any suitable number of cooling fan packages 106. In certain examples, information handling system 100 may be any suitable system including, but not limited to, a 4U server, and a 2U server. One of ordinary skill in the art would recognize that information handling system 100 may include additional components over those shown in FIG. 1 without varying from the scope of this disclosure.

In an example, HDDs 104 may be any suitable type of HDDs including, but not limited to, rotational HDDs. Rotational HDDs 104 may have any suitable rotational speed including, but not limited to, 5,400 rotations per minute (rpm), 7,200 rpm, 10,000 rpm, and 15,000. In certain examples, higher rotational speeds of HDDs 104 may result in higher transfer rates but may need additional cooling from cooling fans 106. HDDs 104 may need to maintain input/output (I/O) throughput performance. However, the I/O throughput of HDDs 104 may be degraded based on acoustical and vibration disturbances created by cooling fans within cooling fan packages 106. Thus, cooling fan packages 106 increasing the airflow to cool HDDs 104 may also increase acoustical and vibration disturbances to the HDDs.

In certain examples, cooling fan packages 106 may pull ambient air from outside of chassis 102 of information handling system 100 across HDDs 104, through the fan packages, and then push the airflow through computing components 108 and out of the chassis of the information handling system. In previous information handling systems, failure of one or more cooling fans may cause re-circulation of the airflow within an information handling system. Information handling system 100 may be improved by fan packages 106 preventing re-circulation of the airflow within information handling system 100, and reducing airflow impedance within the information handling system. In an example, each cooling fan package 106 may include two cooling fans and a fan fin package as will be described with respect to FIGS. 2 and 3 below.

Figure 2:
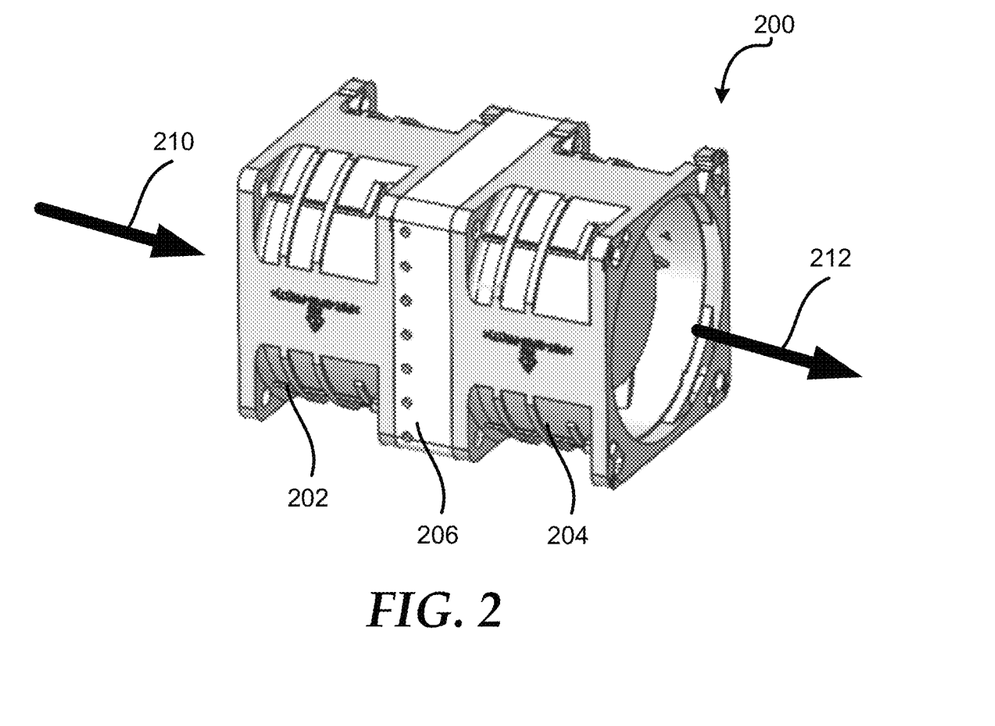
FIG. 2 is a perspective view of a tandem fan package for an information handling system according to at least one embodiment of the disclosure.

FIG. 2 illustrates a tandem fan package 200 for an information handling system, such as information handling system 100 of FIG. 1 according to at least one embodiment of the disclosure. Tandem fan package 200 includes a rear fan 202, a front fan 204, and a fan fin package 206. As shown in FIG. 2, fan fin package 206 is located in between rear fan 202 and front fan 204. In an example, fan fin package 206 is in physical communication with and located in between rear fan 202 and front fan 204. In this example, fan package 200 may not increase a depth of a chassis of an information handling system, such as information handling system 100 of FIG. 1.

Figure 3:
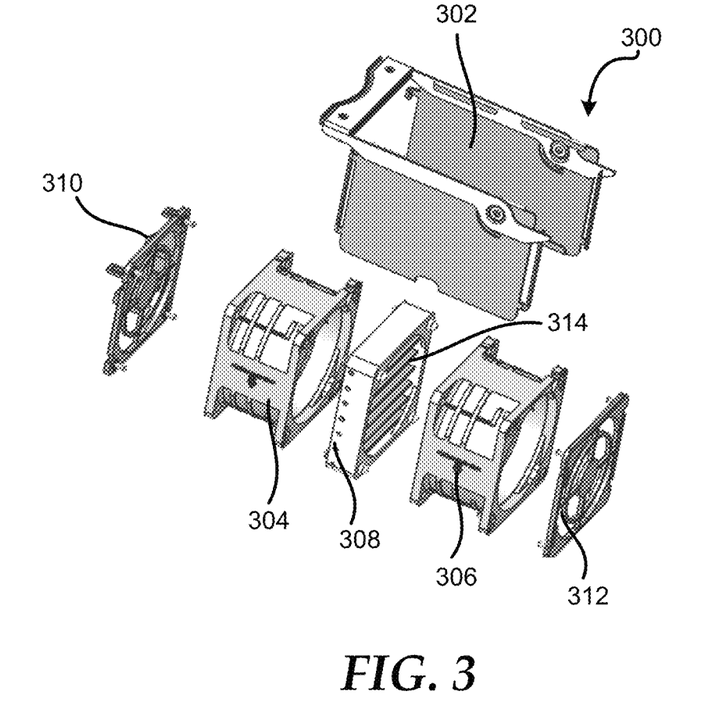
FIG. 3 is an exploded view of a tandem fan package according to at least one embodiment of the present disclosure.

Referring now to FIG. 3, an exploded view of a tandem fan package 300 according to at least one embodiment of the present disclosure is illustrated. Tandem fan package 300 may be any suitable tandem fan package, such as tandem fan fin package 200 of FIG. 2. Tandem fan package 300 includes a fan housing 302, a rear cooling fan 304, a front cooling fan 306, a fan fin package 308, a rear grate 310, and a front grate 312. Fan fin package 308 includes multiple fins 314. In an example, fins 314 may open and close based on operations of cooling fans 304 and 306. For example, in response to at least one of cooling fans 304 and 306 operating, fins 314 may open to enable airflow to flow through tandem fan package 300.

Referring back to FIG. 2, fan fin package 206 may operate to reduce airflow impedance within tandem fan package 200 and in an information handling system, such as information handling system 100 of FIG. 1. Tandem fan package 200 may operate in a number of operational states. For example, a normal operation of tandem fan package 200 may be when both cooling fans 202 and 204 are operational. In this situation, fan fin package 206 may be open and tandem fan package 200 may pull inlet airflow 210 within the fan package, and may push outlet airflow 212. In another operational state of tandem fan package 200, one of the cooling fans, either rear cooling fan 202 or front cooling fan 204, may fail, such that only a single cooling fan is operational. In this situation, fan fin package 206 may remain open so that tandem fan package 200 may pull inlet airflow 210 within the fan package, and may push outlet airflow 212.

Figure 4:
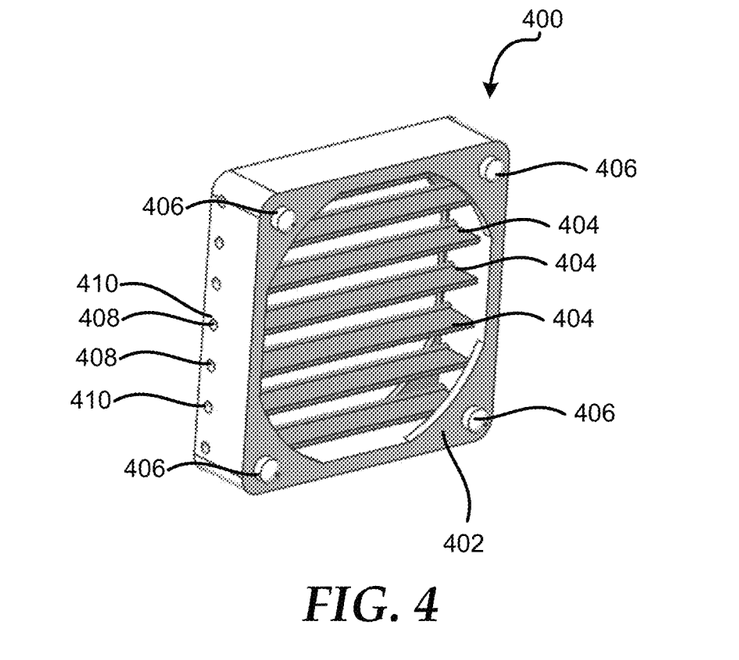
FIG. 4 is a perspective view of a fan fin package according to at least one embodiment of the present disclosure.

Referring now to FIG. 4, a perspective view of a fan fin package 400 according to at least one embodiment of the present disclosure is illustrated. Fan fin package 400 may be any suitable fan fin package, such as fan fin package 206 of FIG. 2, and fan fin package 308 of FIG. 3. Fan fin package 400 includes a case 402, fins 404, and connecting pins 206. Fins 404 may be connected to case 402 via pins 408 of the fins extending through holes 410 of the case.

In an example, connecting pins 406 may provide an interface to connect fan fin package 400 to cooling fans, such as cooling fans 202 and 204 of FIG. 2. Each fin 404 may include pins 408 located at distal ends of the fin. Based on pins 408 be inserted within holes 410 of case 402, fins 404 may be able to rotate between an open position and a closed position. In an example, airflow pulled through a tandem fan package, such as tandem fan package 200 of FIG. 2, by cooling fans may cause fins 400 to rotate to the open position. When both of the cooling fans are off, fins 400 may rotate to a closed position. In certain examples, fins 400 may be biased toward the closed position.

Referring back to FIG. 2, fan fin package 206 may improve a total airflow within the information handling system over previous fan packages whether both rear cooling fan 202 and front cooling fan 204 are operational, or whether only one of the rear and front cooling fans is operational. In previous fan packages of an information handling system, a rear fan may create a swirling airflow towards the front airflow, and the swirling airflow may increase airflow impedance within the fan package and information handling system. In an example, the placement of flapper package 206 in between rear cooling fan 202 and front cooling fan 204 may reduce or remove the swirling effect of the airflow, which in turn may decrease airflow impedance and provide a higher cooling performance within tandem fan package 200 as compared to previous fan packages. For example, fins, such as fins 314 in FIG. 3 or fins 404 in FIG. 4, within fan fin package 206 may direct the airflow from rear fan 202 to front fan 204, such that any swirling caused by the rear fan is removed.

In an example, fins 404 of fan fin package 206 may improve airflow volume at the same fan rotor speed as previous fan packages. Based on the airflow volume created by the directional airflow from fan fin package 206, rear and front cooling fans 202 and 204 may be run at a lower fan rotor speed and produce the same cooling target temperature as compared to previous fan packages. The reduced fan rotor speed may generate a lower vibration within tandem fan package 200 as compared with previous fan package. In an example, the lower vibration levels at higher cooling temperatures may enable HDDs, such as HDDs 104 of FIG. 1, to have improved I/O throughputs at these higher cooling temperatures as compared to previous fan packages.

In an example, a single tandem fan package 200 may be located within each fan package 106 of information handling system 100 in FIG. 1. In certain examples, during operation of the information handling system, each tandem fan package 200 may create airflow within the information handling system. However, if both rear cooling fan 202 and front cooling fan 204 of tandem fan package 200 fail, airflow through the tandem fan package may stop and as a result the fins of fan fin package 206 may transition from the open position to the closed position. Without the fins being in the closed position, airflow within the information handling system may re-circulate through tandem fan package 200 to HDDs 104. In response to the fins of fan fin package 206 being in the closed position, re-circulation of the airflow within information handling system 100 will be prevent.

Figure 5:
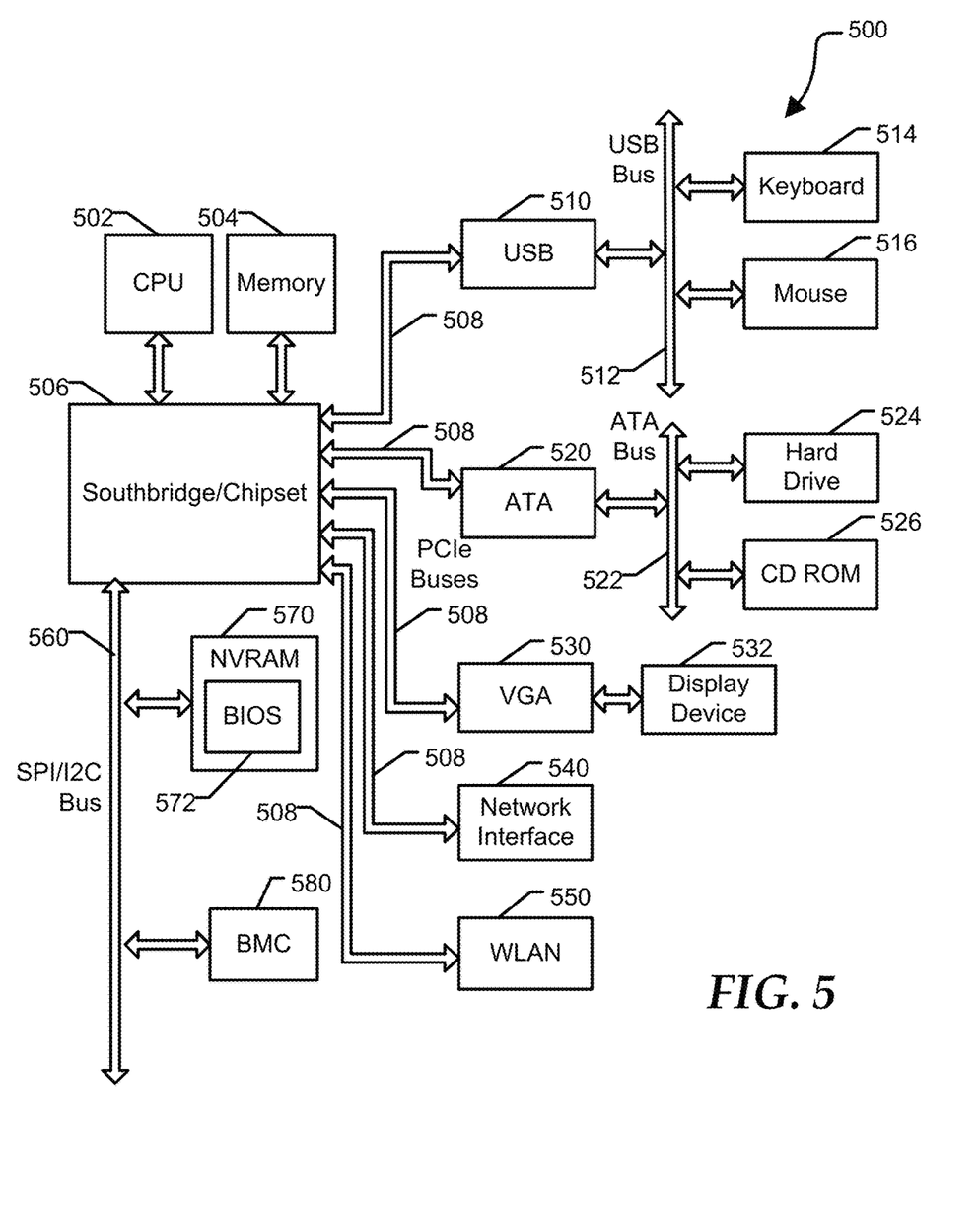
FIG. 5 is a block diagram of a general information handling system according to an at least one embodiment of the present disclosure.

FIG. 5 illustrates a general information handling system 500. Information handling system 500 including a processor 502, a memory 504, a southbridge/chipset 506, one or more PCIe buses 508, a universal serial bus (USB) controller 510, a USB 512, a keyboard device controller 514, a mouse device controller 516, a configuration an ATA bus controller 520, an ATA bus 522, a hard drive device controller 524, a compact disk read only memory (CD ROM) device controller 526, a video graphics array (VGA) device controller 530, a network interface controller (NIC) 540, a wireless local area network (WLAN) controller 550, a serial peripheral interface (SPI) bus 560, a NVRAM 570 for storing BIOS 572, and a baseboard management controller (BMC) 580. In an example, chipset 506 may be directly connected to an individual end point via a PCIe root port within the chipset and a point-to-point topology as shown in FIG. 5. BMC 580 can be referred to as a service processor or embedded controller (EC). Capabilities and functions provided by BMC 580 can vary considerably based on the type of information handling system. For example, the term baseboard management system is often used to describe an embedded processor included at a server, while an embedded controller is more likely to be found in a consumer-level device. As disclosed herein, BMC 580 represents a processing device different from CPU 502, which provides various management functions for information handling system 500. For example, an embedded controller may be responsible for power management, cooling management, and the like. An embedded controller included at a data storage system can be referred to as a storage enclosure processor.

System 500 can include additional processors that are configured to provide localized or specific control functions, such as a battery management controller. Bus 560 can include one or more busses, including a SPI bus, an I2C bus, a system management bus (SMBUS), a power management bus (PMBUS), and the like. BMC 580 can be configured to provide out-of-band access to devices at information handling system 500. As used herein, out-of-band access herein refers to operations performed prior to execution of BIOS 572 by processor 502 to initialize operation of system 500.

BIOS 572 can be referred to as a firmware image, and the term BIOS is herein used interchangeably with the term firmware image, or simply firmware. BIOS 572 includes instructions executable by CPU 502 to initialize and test the hardware components of system 500, and to load a boot loader or an operating system (OS) from a mass storage device. BIOS 572 additionally provides an abstraction layer for the hardware, such as a consistent way for application programs and operating systems to interact with the keyboard, display, and other input/output devices. When power is first applied to information handling system 500, the system begins a sequence of initialization procedures. During the initialization sequence, also referred to as a boot sequence, components of system 500 are configured and enabled for operation, and device drivers can be installed. Device drivers provide an interface through which other components of the system 500 can communicate with a corresponding device.

Information handling system 500 can include additional components and additional busses, not shown for clarity. For example, system 500 can include multiple processor cores, audio devices, and the like. While a particular arrangement of bus technologies and interconnections is illustrated for the purpose of example, one of skill will appreciate that the techniques disclosed herein are applicable to other system architectures. System 500 can include multiple CPUs and redundant bus controllers. One or more components can be integrated together. For example, portions of southbridge/ chipset 506 can be integrated within CPU 502. Additional components of information handling system 500 can include one or more storage devices that can store machine-executable code, one or more communications ports for communicating with external devices, and various input and output (I/O) devices, such as a keyboard, a mouse, and a video display. An example of information handling system 500 includes a multi-tenant chassis system where groups of tenants (users) share a common chassis, and each of the tenants has a unique set of resources assigned to them. The resources can include blade servers of the chassis, input/ output (I/O) modules, Peripheral Component Interconnect-Express (PCIe) cards, storage controllers, and the like.

In an example, information handling system 500 may be any suitable device including, but not limited to, information handling system 500 and servers 512, 514, and 516 of FIG. 5. Information handling system 500 can include a set of instructions that can be executed to cause the information handling system to perform any one or more of the methods or computer based functions disclosed herein. The information handling system 500 may operate as a standalone device or may be connected to other computer systems or peripheral devices, such as by a network.

In a networked deployment, the information handling system 500 may operate in the capacity of a server or as a client user computer in a server-client user network environment, or as a peer computer system in a peer-to-peer (or distributed) network environment. The information handling system 500 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 500 can be implemented using electronic devices that provide voice, video or data communication. Further, while a single information handling system 500 is illustrated, the term "system" shall also be taken to include any collection of systems or sub-systems that individually or jointly execute a set, or multiple sets, of instructions to perform one or more computer functions.

The information handling system 500 can include a disk drive unit and may include a computer-readable medium, not shown in FIG. 5, in which one or more sets of instructions, such as software, can be embedded. Further, the instructions may embody one or more of the methods or logic as described herein. In a particular embodiment, the instructions may reside completely, or at least partially, within system memory 504 or another memory included at system 500, and/or within the processor 502 during execution by the information handling system 500. The system memory 504 and the processor 502 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A fan package for an information handling system, the fan package comprising:
    a rear cooling fan to generate a first airflow;
    a front cooling fan to generate a second airflow; and
    a fan fin package in physical communication with the rear cooling fan and the front cooling fan, the fan fin package including a plurality of fins, wherein an inlet airflow pulled within the fan package and an outlet airflow pushed from the fan package force the fins to rotate from a closed position to an open position, wherein the fins are biased toward the closed position.

2. The fan package of claim 1, wherein the fan fin package is located in between the rear cooling fan and the front cooling fan.

3. The fan package of claim 1, wherein the fins are in the open position in response to the first airflow, the second airflow, or a combination of the first and second airflows.

4. The fan package of claim 3, wherein the fins direct the first airflow from the rear cooling fan to the front cooling fan while the fins are in the open position.

5. The fan package of claim 1, wherein in response to a failure of the rear cooling fan and a failure of the front cooling fan, the fins are in the closed position.

6. The fan package of claim 1, wherein the fins remove a swirling effect of the first airflow before the first airflow is provided to the front cooling fan.

7. The fan package of claim 1, wherein the fan fin package prevents re-circulation of a third airflow in the information handling system when the fins are in the closed position.

8. An information handling system comprising:
    a plurality of hard disk drives; and
    a fan package, the fan package including:
        a rear cooling fan to pull a first airflow from outside of the information handling system and across the hard disk drives;
        a front cooling fan to generate a second airflow; and
        a fan fin package in physical communication with the rear cooling fan and the front cooling fan, the fan fin package including a plurality of fins, the fins to rotate between a closed position and an open position based on the first airflow and the second airflow, wherein the fins are biased toward the closed position.

9. The information handling system of claim 8, wherein the fan fin package is located in between the rear cooling fan and the front cooling fan.

10. The information handling system of claim 8, wherein the fins are in the open position in response to the first airflow, the second airflow, or a combination of the first and second airflows.

11. The information handling system of claim 10, wherein the fins direct the first airflow from the rear cooling fan to the front cooling fan while the fins are in the open position.

12. The information handling system of claim 8, wherein in response to a failure of the rear cooling fan and a failure of the front cooling fan, the fins are in the closed position.

13. The information handling system of claim 8, wherein the fins remove a swirling effect of the first airflow before the first airflow is provided to the front cooling fan.

14. The information handling system of claim 8, wherein the fan fin package prevents re-circulation of a third airflow in the information handling system when the fins are in the closed position.

15. The information handling system of claim 8, wherein the fan fin package enables the rear and front cooling fans to run at a lower speed to produce a specific cooling temperature, wherein the lower speed generates less vibrations within the information handling system.

16. An information handling system comprising:
    a plurality of hard disk drives;
    a plurality of processors; and
    a fan package including:
        a rear cooling fan to pull a first airflow from outside of the information handling system and across the hard disk drives;

a front cooling fan to push a second airflow out of the fan package and across the processors; and a fan fin package in physical communication with the rear cooling fan and the front cooling fan, the fan fin package including a plurality of fins to rotate between a closed position and an open position based on the first airflow and the second airflow, wherein the fins are biased toward the closed position.

17. The information handling system of claim 16, wherein the fan fin package is located in between the rear cooling fan and the front cooling fan.

18. The information handling system of claim 16, wherein the fins direct the first airflow from the rear cooling fan to the front cooling fan while the fins are in the open position.

19. The information handling system of claim 16, wherein the fins remove a swirling effect of the first airflow before the first airflow is provided to the front cooling fan.

20. The information handling system of claim 16, wherein the fan fin package prevents re-circulation of a third airflow in the information handling system when the fins are in the closed position.

* * * * *